(12) United States Patent
Perniola

(10) Patent No.: US 9,123,416 B2
(45) Date of Patent: Sep. 1, 2015

(54) NON-VOLATILE PHASE-CHANGE RESISTIVE MEMORY

(75) Inventor: Luca Perniola, Noyarey (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/343,648

(22) PCT Filed: Sep. 10, 2012

(86) PCT No.: PCT/EP2012/067614
§ 371 (c)(1),
(2), (4) Date: Jul. 11, 2014

(87) PCT Pub. No.: WO2013/037720
PCT Pub. Date: Mar. 21, 2013

(65) Prior Publication Data
US 2014/0355338 A1    Dec. 4, 2014

(30) Foreign Application Priority Data

Sep. 9, 2011  (FR) ...................................... 11 58031
Apr. 6, 2012  (FR) ...................................... 12 53212

(51) Int. Cl.
*G11C 11/21* (2006.01)
*G11C 13/00* (2006.01)
*H01L 45/00* (2006.01)

(52) U.S. Cl.
CPC ........ *G11C 13/0069* (2013.01); *G11C 13/0004* (2013.01); *H01L 45/06* (2013.01);
(Continued)

(58) Field of Classification Search
CPC .................................................. G11C 13/0004
USPC .................................................. 365/163, 148
See application file for complete search history.

(56) References Cited

U.S. PATENT DOCUMENTS

2008/0149912 A1    6/2008   Nakai
2008/0175042 A1    7/2008   Kang et al.
(Continued)

FOREIGN PATENT DOCUMENTS

WO    2008 117455    10/2008

OTHER PUBLICATIONS

Beneventi, B. G. et al., "Carbon-doped GeTe Phase-Change Memory featuring remarkable RESET current reduction" IEEE, pp. 313-316, 2010 XP 31787433.

(Continued)

*Primary Examiner* — Hoai V Ho
*Assistant Examiner* — Jay Radke
(74) *Attorney, Agent, or Firm* — Oblon, McClelland, Maier & Neustadt, L.L.P.

(57) ABSTRACT

A method for implementing a system containing at least one memory device including a plurality of non-volatile memory cells each including a phase-change material configured to change state reversibly between at least an amorphous state and a crystalline state having different electrical resistances. The method includes steps of manufacturing the memory cells, including the formation of a layer of a phase-change material having an original amorphous state at the end of the steps of manufacturing the memory cells. The method for implementing the embedded system includes, after the steps of manufacturing the memory cells, at least the following steps: (i) pre-programming the memory device consisting of an electrical recrystallization of a selection of memory cells from their original amorphous state; and (ii) assembling the pre-programmed memory device in the system during which the device is subjected to a temperature of between 240° C. and 300° C.

23 Claims, 9 Drawing Sheets

(52) U.S. Cl.
    CPC .......... *H01L45/1233* (2013.01); *H01L 45/144* (2013.01); *H01L 45/16* (2013.01); *G11C 2013/0083* (2013.01)

(56) References Cited

U.S. PATENT DOCUMENTS

| | | | | |
|---|---|---|---|---|
| 2008/0237566 | A1* | 10/2008 | An et al. | 257/4 |
| 2009/0003034 | A1 | 1/2009 | Happ et al. | |
| 2009/0057644 | A1 | 3/2009 | Shin et al. | |
| 2009/0101882 | A1* | 4/2009 | Chen et al. | 257/3 |
| 2009/0302293 | A1 | 12/2009 | Morikawa et al. | |

OTHER PUBLICATIONS

Perniola, L. et, al. "Ti impact in C-doped phase-change memories compliant to Pb-free soldering reflow" Electron Devices Meeting (IEDM), IEEE International, 1 page, Dec. 10-13, 2012.

International Search Report Issued Jan. 8, 2013 in PCT/EP12/067614 Filed Sep. 10, 2012.

\* cited by examiner

NON-VOLATILE PHASE-CHANGE RESISTIVE MEMORY

CROSS REFERENCE TO RELATED APPLICATIONS

The present application is a 35 U.S.C. §371 national stage patent application of International patent application PCT/EP2012/067614, filed on Sep. 10, 2012, published as WO/2013/037720 on Mar. 21, 2013, the text of which is incorporated by reference, and claims the benefit of the filing date of French application nos. 11 58031, filed on Sep. 9, 2011, and 12 53212, filed on Apr. 6, 2012, the text of each of which is also incorporated by reference.

TECHNICAL FIELD OF THE INVENTION

The present invention concerns in general non-volatile resistive memories using a material the resistivity of which is made to vary under the effect of heat, and more particularly a resistive memory that can be used in the context of an industrial process for managing embedded systems where it is highly advantageous to be able to pre-programme it without the information stored being able to be affected by the following operations, in particular the thermal assembly operations comprising steps of soldering or brazing by refusion of the components.

PRIOR ART

Computerised embedded systems always very widely have recourse, in addition to the electronic, optical or mechanical elements particular to each system, to the use of microprocessors or microcontrollers and the electronic memories necessary for ensuring functioning thereof. Typically all the components constituting an embedded system are assembled on one or more printed circuits or electronic cards often also referred to by the English term PCB, that is to say printed circuit board. Assembly is generally automated in a manufacturing line. The electronic components are usually in the form of components intended to be surface mounted (without through pins). They are then simply placed on the printed circuit by a placing machine. Prior to this, a deposition of a soldering or brazing paste on the terminations of the components and/or those of the printed circuit would have been carried out. The printed circuit on which the components have been placed is then passed through a heating oven, typically a so-called tunnel oven where the temperature gradient is adjusted in order to melt the deposited paste which, after cooling, provides mechanical mixing of the components and excellent electrical contact. This standard operation for manufacturing a printed circuit is referred to as soldering or brazing by refusion or, in English technical literature, "solder reflow".

Almost always at least some of the memories constituting an embedded system are of the non-volatile type. For example, in order to be able to store therein permanently the operational code, generally referred to as the microcode, of the microprocessor(s) or microcontroller(s) that serve to fulfil the function for which the embedded system was designed. It is then normal practice for the manufacturing process to require the non-volatile part of the memories to be able to be programmed before mounting thereof on the printed circuit. A very important advantage of this procedure is that it is then possible for example to pre-programme, in the non-volatile part, a specific code intended to test the printed circuit immediately after assembly so as to check its integrity. Another example of an advantage related to the possibility of being able to pre-programme the non-volatile memories concerns protected chip cards often referred to by their English term "secure smart cards". The issuers of such cards, for example banks, much prefer for the confidential data that they contain to be able to be introduced therein before assembly in order not to have to control the distribution of this sensitive information beyond the manufacturing line.

If the operational code or functional data that a non-volatile memory must contain had not been pre-programmed, they will then have to be able to be loaded in situ, that is to say in the non-volatile memory after it has been assembled and interconnected with the other components on the printed circuit. Means have been developed for a long time by the microelectronic industry in order to fulfil this function after assembly. Normal practice is to use the test circuits that are contained in almost all the circuits developed by this industry, in particular so-called JTAG circuits, the acronym for Joint Test Action Group, which designates a working group that defined a strategy and means for testing printed circuits as from the middle of the 1980s in order to be able to ensure, after manufacture, correct functioning of more and more complex circuits. Having become a standard, the JTAG circuits make it possible to individually access the components assembled on a printed circuit through a specialised serial interface that can also allow in situ programming of the non-volatile memory part. The intrinsically low access speed and the limited available bandwidth of this method means that loading the code is an operation that may take a great deal of time and slow down the manufacturing line.

Other means have been designed for the in situ programming of the non-volatile part of the memories that have their own drawbacks such as requiring specialised connection points that will have no functional utility and/or an interface dedicated to this function to enable, firstly, the writing of the code in the non-volatile memory part, and secondly, control of the other components so that they can be inhibited so as not to interfere with the loading of the code. This inevitably greatly complicates the design of the embedded system and also generally requires the development of a specialised programming tool for loading the code after assembly in the manufacturing line.

Whenever it is possible, it is therefore preferred to load all the code necessary, that is to say not only the test code but also the functional code, before assembly. This avoids having recourse to an in situ programming with all the drawbacks briefly mentioned above.

The non-volatile memories currently used are essentially so-called Flash memories in which each memory point is a metal-oxide-semiconductor (MOS) transistor having a floating gate in which carriers are trapped. These memories are programmed by applying to the electrodes voltages higher than those used for reading thereof. These voltages make it possible to bring charges into the floating gate, or to discharge them, in order to permanently modify, in reading, the conduction threshold of the transistor in order to be able to store therein at least two different electrical levels, that is to say an information bit. The trapping and discharge of the carriers is done through the very thin oxide layer forming the gate of the MOS transistor, using quantal effects of the hot electron or tunnel effect type. This type of non-volatile storage is not particularly affected by temperature. Flash memories very well withstand programming before assembly. The content thereof is not altered by the solder reflow operation described above in which, typically, the maximum temperature reached is around 245° C. for a period of time from 10 to 40 seconds for the solder pastes containing lead. The use of lead-free pastes, now required for their non-polluting character, increases the maximum temperature up to 260° C., which remains without any negative effect on the retention of the pre-programmed data in this type of memory. The main drawback of these memories is that programming thereof requires, as seen above, being able to apply high voltages and currents in order to transfer charges in or from the floating gate. Writing thereof is a relatively slow and complicated operation that may have to be done, according to their internal structure of the so-called ET or OR type, on blocks of cells that must be deleted before being rewritten with the new data.

This is why non-volatile memories of the Flash type now tend to be replaced by resistive memories using a phase-change material the atomic structure of which is varied reversibly under the effect of heat. Designated by the acronym PCM (phase change memory), these memories are preferred to Flash memories for the development of new products since they are intrinsically denser and writing thereof much simpler and rapid than Flash memories. Typically the phase-change material used is a chalcogenide and in particular an alloy of germanium (Ge), antimony (Sb) and tellurium (Te) known by the acronym GST. Designed to operate at temperatures up to 85° C. for 10 years, PCM memories are intrinsically, through the very fact of their operating principle very briefly disclosed above, directly sensitive to the temperature of the environment in which they have to function. The retention time decreases very rapidly as a function of the temperature to which they are subjected. For a period of 10 years at 85° C., the retention time typically falls to 10 hours at 125° C., to 10 seconds at 165° C. and finally to 10 microseconds at 225° C. Clearly resistive memories of the PCM type cannot therefore be usefully pre-programmed before assembly since the information stored will then be lost during the solder reflow phase, where temperatures of up to 260° C. may be applied.

It would be particularly advantageous to have available memory cells affording a great density of integration and quick writing which would also be capable of retaining their information at relatively high temperatures.

The present invention aims to meet this objective.

Another objective of the invention is to propose a solution for enabling a memory cell not to lose, during an assembly operation, programming previously effected.

The other objects, features and advantages of the present invention will emerge from an examination of the following description and the accompanying drawings. Naturally other advantages may be incorporated.

SUMMARY OF THE INVENTION

One aspect of the present invention concerns a non-volatile memory cell comprising a phase-change material configured to reversibly change state between at least one amorphous state and a crystalline state having different electrical resistances, characterised in that:
   the phase change material is a layer made from alloy of germanium (Ge) and tellurium (Te) with carbon (C) or indium (In) added, or is made from an alloy of germanium (Ge), antimony (Sb) and tellurium (Te) with carbon (C) or indium (In) added, in which the proportion of carbon (C) or Indium (In) in the alloy is between 1% and 25%;
   the phase-change material layer is covered with a layer of titanium (Ti) the thickness of which is between 3 and 10 nanometers.

It turned out, unexpectedly, that the amorphous phase of this alloy having a specific addition of carbon or indium and associated with the layer of titanium has significantly improved stability faced with temperature rises. In particular, this amorphous phase is not altered by the subsequent steps of manufacture of a device including the memory cell, even when these steps comprise thermal refusions, brazing or soldering. Furthermore, the invention benefits from the advantages related to the phase-change memory cells in terms of writing time.

Optionally, the memory cells according to the invention may comprise at least any one of the features stated below:
   Advantageously, the proportion of carbon (C) or indium (In) in the alloy is between 3% and 25% and preferably between 5% and 20%.
   Advantageously, the phase-change material is a layer made from an alloy of germanium (Ge) and tellurium (Te) with carbon (C) added, the proportion of carbon (C) in the alloy being between 5% and 20%.
   Advantageously, the phase-change material is a layer made from an alloy of germanium (Ge) and tellurium (Te) with indium (In) added and the proportion of indium (In) in the alloy is between 5% and 20%.
   Advantageously, the thickness of the layer of titanium is between 3 and 8 nanometers. It is preferably between 4 and 6 nanometers. Even more preferentially, it is equal to 5 nanometers.
   According to an advantageous alternative, the proportion of carbon (C) or indium (In) in the alloy is between 5% and 20% and the thickness of the layer of titanium is approximately 5 nanometers.
   Preferably, the layer of titanium is in contact with the layer of phase-change material.
   Preferably, the layer of phase-change material has a bottom face in contact with a heating means or a bottom electrode and a top face in contact with the layer of titanium. Preferably, the layer of titanium is in contact with a top electrode. Preferably, the bottom face of the layer of phase-change material is in contact with a heating means disposed in contact with bottom electrode. Alternatively, the bottom face of the layer of phase-change material is in contact with a bottom electrode forming a heating means.
   Advantageously, the recrystallisation temperature of the layer of phase-change material associated with the layer of titanium is greater than 400° C.
   According to a particular embodiment, the cell comprises several crystalline states and/or several amorphous states, each of these states having a different resistivity.

According to another aspect, the invention relates to a non-volatile memory cell comprising a phase-change material configured so as to reversibly change state between at least an amorphous state and a crystalline state having different electrical resistances, the memory cell being characterised in that:
   the temperature of passing from the original amorphous state, obtained during the formation of the layer, to a crystalline state is above 350° C. and preferably above 400° C. and even more preferentially above 450° C.

Preferably, the phase-change material is a layer covered with a layer of titanium (Ti) the thickness of which is between 3 and 10 nanometers.

More generally, the memory cell is conformed so that the temperature necessary for passing from the original amorphous state to a crystalline state is greater than the maximum temperature to which the memory cell is subjected during manufacture thereof, or even during the manufacture of the interconnections.

According to another aspect, the invention relates to a method for manufacturing a non-volatile memory cell comprising a phase-change material, also referred to as a resistivity-change material, configured so as to reversibly change state between at least one amorphous state and a crystalline state having different electrical resistances, the method being characterised in that it comprises:

a step of depositing a layer of phase-change material consisting of an alloy of germanium (Ge) and tellurium (Te) with carbon (C) or indium (In) added or consisting of an alloy of germanium (Ge), antimony (Sb) and tellurium (Te) with carbon (C) or indium (In) added, the alloy being in an amorphous state during the deposition step, the proportion of carbon (C) or indium (In) in the alloy being between 1% and 25%, the deposition step being performed at a temperature below the crystallisation temperature of said layer of phase-change material;

a step of depositing a layer of titanium (Ti) with a thickness of between 3 and 10 nanometers.

Optionally, the method for manufacturing a memory cell of the invention may comprise at least any one of the following optional steps and features taken alone or in combination:

The step of depositing the layer of phase-change material is adjusted so that the proportion of carbon (C) or indium (In) in the alloy is in a range laying between 3% and 25% and preferably between 5% and 20%.

The step of depositing the layer of titanium is adjusted so as to obtain a thickness of titanium of between 4 and 6 nanometers.

According to an advantageous alternative, the phase-change material consists of an alloy of germanium (Ge), tellurium (Te) and carbon (C), the step of depositing the layer of phase-change material is adjusted so that the proportion of carbon (C) in the alloy is between 3% and 20% and the step of depositing the layer of titanium is adjusted so as to obtain a thickness of titanium of between 3 and 8 nanometers.

Advantageously, the deposition of the layer of phase-change material is performed at ambient temperature. Advantageously, the deposition of the layer of titanium is performed at ambient temperature. The deposition of these layers at ambient temperature accelerates the manufacturing process and reduces the costs thereof. This is because it is not then necessary to await the stabilisation of the temperature in the oven before deposition.

Advantageously, the deposition of the layer of phase-change material and the deposition of the titanium layer are performed in vapour phase in a confined chamber at low pressure and ambient temperature.

According to another aspect, the invention relates to a microelectronic device integrating a plurality of memory cells according to any one of the preceding features.

Optionally, the device according to the invention may comprise at least any one of the optional features stated below taken alone or in combination.

According to an advantageous embodiment, the device forms a read-only memory (ROM) or a programmable read-only memory (PROM) or a memory programmable only once (OTP).

Advantageously, some of the memory cells are in an original amorphous state and the rest of the memory cells are in a crystalline state obtained by at least partial crystallisation of the phase-change material from the original amorphous state. It should be stated here that the original amorphous state is the amorphous state in which the phase-change material is situated at the end of the manufacture of the memory cell.

Advantageously, the device comprises reading means or reading circuits configured so as to read the memory cells and to differentiate the memory cells situated in an original amorphous state with respect to the memory cells situated in a crystalline state obtained by at least partial crystallisation of the phase-change material from the original amorphous state.

According to a particular embodiment, the device comprises reading means exclusively configured to differentiate the memory cells situated in an original amorphous state with respect to the memory cells situated in a crystalline state obtained from the original amorphous state.

Advantageously, the device comprises writing circuits able to bring the memory cells from an original amorphous state into a crystalline state. The writing means thus make it possible to pre-programme the cell from the resistive state obtained following the manufacture of the memory cell.

According to an advantageous embodiment, at least some of the memory cells are in a functional amorphous state different from an original amorphous state or at least some of the memory cells are in a functional crystalline state different from a crystalline state obtained by at least partial crystallisation of the phase-change material from the original amorphous state. Thus the device comprises a memory cell that has undergone at least one step of conversion from the original amorphous state or from the pre-programming crystalline state to functional states. According to one embodiment, at least some of the memory cells are in an original amorphous state or in a crystalline state obtained by at least partial crystallisation of the phase-change material from the original amorphous state. Thus this device comprises memory cells having either an original amorphous state or a crystalline state issuing from the original amorphous state, or a functional amorphous state or a functional crystalline state. Thus a memory cell may be in one of the four possible resistive states.

Advantageously, the device comprises circuits for writing the memory cells configured so as to convert the original amorphous state into one from a functional amorphous state different from an original amorphous state or into a functional crystalline state different from a crystalline state obtained by at least partial crystallisation of the phase-change material from the original amorphous state. Advantageously, the device comprises writing circuits configured so as to convert the crystalline state obtained from the original amorphous state into the other one from the functional amorphous state and the functional crystalline state. Advantageously, these writing circuits make it possible to correct the programming of memory cells.

According to another aspect, the invention relates to the use of a device according to the invention as a read-only and single-programming memory device.

According to another aspect, the invention relates to a method for implementing an embedded system comprising at least one memory device including a plurality of non-volatile memory cells each comprising a phase-change material configured so as to reversibly change state between at least an amorphous state and a crystalline state having different electrical resistances, characterised in that it comprises steps for manufacturing memory cells, these manufacturing steps comprising the formation of a layer as a phase-change material having an original amorphous state at the end of the steps of manufacturing memory cells, said method for implementing the embedded system further comprising, after the steps of manufacturing the memory cells:

a step of pre-programming the memory device consisting of an electrical recrystallisation of a selection of memory cells from their original amorphous state;

a step of assembling the memory device pre-programmed in the embedded system during which the memory device undergoes thermal stress.

According to another aspect, the invention relates to a method for implementing a system comprising at least one device according to the invention, the method comprising steps of manufacturing the memory cells, these manufacturing steps comprising the formation of a layer made from a phase-change material having an original amorphous state, said method for implementing the system comprising, after the steps of manufacturing the memory cells, at least the following steps: a step of pre-programming the device consisting of an electrical recrystallisation of a selection of memory cells from their original amorphous state; a step of assembling the pre-programmed device in the system.

According to another aspect, the invention relates to a method for implementing a system comprising at least one memory device including a plurality of non-volatile memory cells each comprising a phase-change material configured so as to reversibly change state between at least an amorphous state and a crystalline state having different electrical resistances, characterised in that it comprises steps of manufacturing the memory cells, these manufacturing steps comprising the formation of a layer made from a phase-change material having an original amorphous state at the end of the steps of manufacturing the memory cells, said method for implementing the embedded system comprising, after the steps of manufacturing the memory cells, at least the following steps:

a step of pre-programming the memory device consisting of an electrical recrystallisation of a selection of memory cells from their original amorphous state;

a step of assembling the pre-programmed memory device in the system during which the device is subjected to a thermal stress, for example a temperature of between 240° C. and 300° C.

Advantageously, this temperature to which the memory device is subjected during the assembly step is therefore lower than the BEOL temperature, typically between 350° C. and 450° C.

Thus this aspect of the present invention is not limited to the phase-change materials made from an alloy of germanium (Ge) and tellurium (Te) and optionally antimony (Sb) with carbon (C) and indium (In) added. It is also not limited to cells wherein the phase-change material layer is covered by a layer of titanium (Ti) the thickness of which is between 3 and 10 nanometers.

Advantageously but non-limitatively, the phase-change material is chosen so that the resistance of the memory cells the phase-change material of which is in the original amorphous state is, after the assembly step, at least 1.5 times greater and preferably at least twice as great as the resistance of the memory cells the phase-change material of which is in the crystalline state. More generally, it suffices that, on a sample of memory cells, the lowest resistance of the memory cells of this sample situated in the original amorphous state is, after the assembly step, at least 1.5 times greater and preferably at least twice as great as the highest resistance of the cells in this sample situated in the crystalline state. In other words the distributions of the resistances of the memory cells in the original amorphous state and the memory cells in the crystalline state, after the assembly step, must have a difference of at least a factor of 1.5 and preferably of at least a factor of two. Preferably this factor is greater than or equal to five and even more preferably greater than or equal to ten.

According to an optional and advantageous embodiment, the phase-change material is a layer made from an alloy of germanium (Ge), antimony (Sb) and tellurium (Te) or an alloy of germanium (Ge) and tellurium (Te), the alloy having carbon (C) added, in which the proportion of carbon (C) in the alloy is between 1% and 25%. According to another optional and advantageous embodiment, the phase-change material is a layer (20) made from an alloy of germanium (Ge), antimony (Sb) and tellurium (Te) or an alloy of germanium (Ge) and tellurium (Te), the alloy having indium (In) added, in which the proportion of indium (In) in the alloy is between 1% and 25%. Advantageously, the layer of phase-change material is covered by a layer of titanium (Ti) the thickness of which is between 3 and 10 nanometers.

In general terms, the original amorphous state is the state, at least partly amorphous and preferably completely amorphous, that is obtained at the end of the method for manufacturing memory cells and which has not been altered by any passage of programming current.

According to another aspect, the invention relates to a method for implementing a system comprising at least one device integrating a plurality of non-volatile memory cells, the non-volatile memory cells each comprising a phase-change material configured so as to reversibly change state between at least an amorphous state and a crystalline state having different electrical resistances, the phase-change material being a layer made from an alloy of germanium (Ge) and tellurium (Te) with carbon (C) or indium (In) added or being made from an alloy of germanium (Ge), antimony (Sb) and tellurium (Te) with carbon (C) or indium (In) added in which the proportion of carbon (C) or indium (In) in the alloy is between 1% and 25%; the layer made from a phase-change material having an amorphous state, the phase-change material layer being covered by a layer of titanium (Ti) the thickness of which is between 3 and 10 nanometers, said method for implementing the system comprising at least the following steps: a step of pre-programming the device performed before a step of assembling the device in the system, the pre-programming step consisting of an electrical recrystallisation of a selection of memory cells from their original amorphous state; a step of assembling the pre-programmed device in the system during which the device is subjected to a temperature of between 240° C. and 300° C.

According to another embodiment, the present invention relates to a method for implementing a system comprising at least one device integrating a plurality of non-volatile memory cells, the method comprising steps of manufacturing the memory cells of the device, these manufacturing steps comprising the formation of a layer made from a phase-change material configured so as to reversibly change state between at least an amorphous state and a crystalline state having different electrical resistances, the phase-change material being a layer made from an alloy of germanium (Ge) and tellurium (Te) with carbon (C) or indium (In) added or being made from an alloy of germanium (Ge), antimony (Sb) and tellurium (Te) with carbon (C) or indium (In) added in which the proportion of carbon (C) or indium (In) in the alloy is between 1% and 25%; said steps of manufacturing the memory cells further comprising the formation of a layer of titanium (Ti) covering the layer of phase-change material and the thickness of which is between 3 and 10 nanometers, the layer made from a phase-change material having an original amorphous state at the end of the steps of manufacturing the memory cells, said method for implementing the system comprising, after the steps of manufacturing the memory cells, at least the following steps:

a step of pre-programming the device consisting of an electrical recrystallisation of a selection of memory cells from their original amorphous state;

a step of assembling the pre-programmed device in the system.

According to another embodiment, the present invention relates to a method for pre-programming a system comprising at least one device integrating a plurality of non-volatile memory cells each comprising a phase-change material configured so as to reversibly change state between at least an amorphous state and a crystalline state having different electrical resistances, the phase-change material being a layer made from an alloy of germanium (Ge) and tellurium (Te) with carbon (C) or indium (In) added or being made from an alloy of germanium (Ge), antimony (Sb) and tellurium (Te) with carbon (C) or indium (In) added in which the proportion of carbon (C) or indium (In) in the alloy is between 1% and 25%; the layer of phase-change material being covered by a layer of titanium (Ti) the thickness of which is between 3 and 10 nanometers, the layer made from a phase-change material having an original amorphous state, said method for programming the system comprising at least the following steps:

before assembly of the pre-programmed device in the system, a step of pre-programming the device consisting of an electrical recrystallisation of a selection of memory cells from their original amorphous state, a step of assembling the pre-programmed device in the system.

Optionally, the methods of the invention may each comprise at least any one of the steps and features stated below taken alone or in combination.

Advantageously, the assembly step comprises a brazing or soldering step.

The assembly step comprises a step during which the device undergoes a thermal stress. Typically a thermal stress comprises the application of a temperature above 240° C. or even above 300° C.

Preferably, during the steps of manufacturing memory cells, the latter are subjected to temperatures above the temperatures imposed during the assembly step.

The steps of manufacturing the memory cells preferably comprise all the steps for making the cells operational. They comprise in particular the stacking of the various layers and their interconnections.

According to another embodiment, the present invention relates to the use of a system as a read-only and single-programming memory produced by implementing any one of the methods according to the invention.

According to another embodiment, the present invention relates to the use, as a read-only and single-programming memory device, of a device integrating a plurality of non-volatile memory cells each comprising a phase-change material configured so as to reversibly change state between at least an amorphous state and a crystalline state having different electrical resistances, the phase-change material being a layer made from an alloy of germanium (Ge) and tellurium (Te) with carbon (C) or indium (In) added or is made from an alloy of germanium (Ge), antimony (Sb) and tellurium (Te) with carbon (C) or indium (In) added in which the proportion of carbon (C) or indium (In) in the alloy is between 1% and 25%; the layer of phase-change material being covered by a layer of titanium (Ti) the thickness of which is between 3 and 10 nanometers.

According to another embodiment, the present invention relates to a system obtained using any one of the methods according to the invention, the device forming a read-only memory (ROM) or a read-only programmable memory (PROM) or a memory programmable only once (OTP).

Optionally, this system may comprise at least any one of the features stated below taken alone or in combination.

the phase-change material is a layer made from an alloy of germanium (Ge) and tellurium (Te) with carbon (C) or indium (In) added or is made from an alloy of germanium (Ge), antimony (Sb) and tellurium (Te) with carbon (C) or indium (In) added in which the proportion of carbon (C) or indium (In) in the alloy is between 1% and 25% and the layer of phase-change material is covered by a layer of titanium (Ti) the thickness of which is between 3 and 10 nanometers;

some of the memory cells are in an original amorphous state and the rest of the memory cells are in a crystalline state obtained by at least partial crystallisation of the phase-change material from the original amorphous state;

the system comprises read circuits configured so as to read the memory cells and differentiate the memory cells situated in an original amorphous state with respect to the memory cells situated in a crystalline state obtained by at least partial crystallisation of the phase-change material from the original amorphous state;

the device of the system comprises writing circuits able to bring the memory cells from an original amorphous state into a crystalline state;

the device of the system comprises circuits for writing to the memory cells configured to convert the original amorphous state into one from a functional amorphous state different from an original amorphous state or a functional crystalline state different from a crystalline state obtained by at least partial crystallisation of the phase-change material from the original amorphous state and/or configured to convert the crystalline state obtained from the original amorphous state into the other one from the functional amorphous state and the functional crystalline state.

The original amorphous state is the state obtained during deposition. It remains unchanged at the end of the steps for manufacturing the memory cells or even the steps enabling them to be interconnected. The properties of the layer of phase-change material are thus preserved even at the end of the BEOL (back end of line) steps, that is to say those at the end of the manufacturing line during which the interconnection of the cells is effected.

The phase-change material thus preserves its original amorphous state as deposited despite the steps of manufacturing and interconnecting the cells. Its recrystallisation temperature is higher than the normal BEOL temperatures. During pre-programming, some cells are intentionally recrystallised. The plurality of cells then contains pre-programmed information. During the step of assembling the plurality of memory cells in a system, the temperatures to which the memory cells are subjected are not sufficient to modify the state of the cells.

Preferably, the phase-change material is a layer made from an alloy of germanium (Ge), tellurium (Te) and carbon (C) or indium (In) or made from an alloy of germanium (Ge), antimony (Sb), tellurium (Te) and carbon (C) or indium (In) in which the proportion of carbon (C) or indium (In) is between 1% and 25% and preferably between 3% and 25%. Furthermore the layer of phase-change material is covered by a layer of titanium (Ti) the thickness of which is between 3 and 10 nanometers.

Advantageously, the method comprises, after the assembly step, a step of converting, for each cell of the memory device, from the original amorphous state or the pre-programmed crystalline state into respectively: an electrically-programmed functional amorphous state with high resistance, or into an electrically-programmed functional crystalline state with low resistance.

Advantageously, the memory cells can thus be read and written to use the lower currents. Advantageously, the SET and RESET operations are made much more rapid.

Alternatively, the method comprises, after the assembly step, a step of conversion, for each cell of the memory device, from the original amorphous state or from the pre-programmed crystalline state into respectively: an electrically-programmed functional crystalline state with low resistance, or an electrically-programmed functional amorphous state with high resistance.

In this embodiment the crystalline and amorphous phases are reversed during the conversion step. This embodiment offers the same advantages as the previous one.

Preferably, the conversion step is executed under the control of the memory device from circuits for reading and writing to the memory cells, said read and write circuits being provided with means adapted to be able to differentiate, in each cell: the original amorphous state, the pre-programmed crystalline state, the amorphous functional state and the crystalline functional state.

Preferably the recrystallisation of the pre-programming step comprises an electrical programming also referred to as electrical annealing, which is applied to a selection of cells from their original amorphous state.

The cells have, before pre-programming, a high-resistance amorphous state. They have, when they are crystallised, a low resistance.

Advantageously, the method further comprises a step of checking the embedded system by means of a pre-programmed code.

Advantageously, the method further comprises a step of activating a pre-programmed functional code.

Advantageously, the method comprises, after the steps of manufacturing the memory cells and before the step of assembling the pre-programmed memory device in the system, a step of mounting the memory cells in a can.

According to one embodiment, the step of mounting the memory cells in the can is performed after the step of pre-programming the memory device. This embodiment is advantageous for reasons of protecting the data in particular. According to an alternative, the step of mounting the memory cells in the housing is performed before the step of pre-programming the memory device.

BRIEF DESCRIPTION OF THE FIGURES

The aims, objects, features and advantages of the invention will emerge more clearly from the detailed description of an embodiment of it that is illustrated by the following accompanying drawings, in which.

Figure 1:
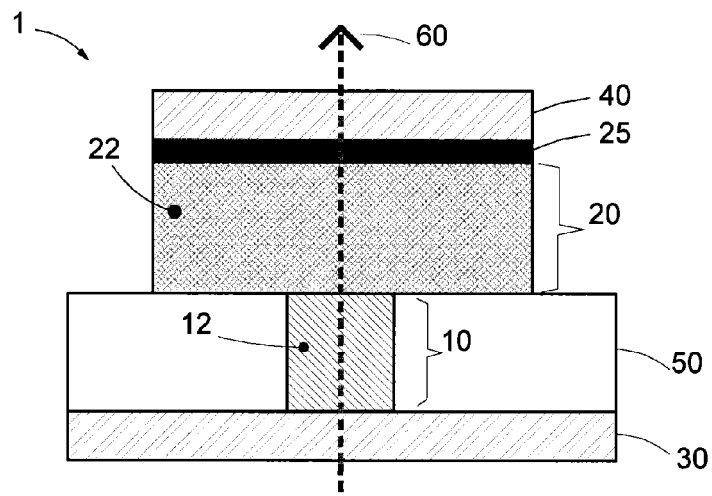
FIG. 1 illustrates, by means of a view in cross-section, an example of a memory cell of the PCM type according to the invention.

The accompanying drawings are given by way of examples and are not limitative of the invention.

DETAILED DESCRIPTION OF THE INVENTION

The so-called PCM resistive memories use a material the atomic structure of which can be varied under the effect of heat. The material constituting the memory element may change between two main solid phases: one where the material adopts a crystalline organised structure characterised by a low electrical resistance; and the other where the atomic structure is unorganised or amorphous and has high electrical resistance. Intermediate states may exist. It is necessary to remark that only the completely crystalline state is however naturally stable. In an environment where the material is subjected to higher temperatures than the maximum one for which it was designed to operate, it tends naturally to reorganise itself in a crystalline form. The amorphous states are energetically termed metastable, the associated information being lost if the material is subjected to a thermal stress.

In electronic memories of the PCM type it is the passage of a programming current that causes the heating of the phase-change material and its change between its various phases. By controlling durations and waveforms of the programming pulses, a resistive state is obtained after cooling that can be read by means of suitable peripheral circuits. Traditionally, the term "SET" is applied to the current and programming operation that enables recrystallisation of the phase-change material and therefore make it possible to obtain in reading a low resistance value. The programming current, and the operation referred to as "RESET", next cause amorphisation, generally partial, of the phase-change material until a higher predetermined resistive state is obtained that will be characteristic, in combination with the low resistance of the crystalline state, of the information stored by the memory element.

Conventionally, the SET operation that leads to the recrystallisation of the material and the obtaining of a low resistance delivers a high current to the peripheral reading circuit that reads a "1". The RESET operation that causes the amorphisation of the material leads to the reverse result: a high resistance with a low current delivered is read as being a "0". Functionally, the reverse convention on the 0 and 1 logic states may just as well be adopted without drawback. To avoid any confusion the present application makes no reference to these 0 and 1 logic states but only to the two main states, one amorphous with high resistance and the other crystalline with low resistance.

The amorphous and crystalline states are termed stable in that they remain in their respective states in the absence of high thermal stress. Beyond a certain temperature, as seen previously, their state may be altered.

As seen in the section on the prior art, the current devices typically use a chalcogenide known by the acronym GST, an alloy of germanium (Ge), antimony (Sb) and tellurium (Te), as a phase-change material capable of functioning at temperatures up to 85° C. for 10 years. The GST is therefore not suitable for producing non-volatile memories that can be pre-programmed before assembly and must be able to withstand, without loss of information, the up to 260° C. thermal stress of the solder reflow.

FIG. 1 illustrates, by means of a view in cross section, a memory cell 1 of the PCM type that meets this need. This structure comprises a heating means 10, also referred to as a heating element, directly in contact at one of its ends with a layer 20 consisting of a phase-change material 22. The heating means 10 or heating element 10 is generally embedded in a layer 50 of an insulator, typically silicon dioxide ($SiO_2$). It is for example produced in a metal 12 such as tungsten (W) that can withstand high temperatures without any drawback.

The memory structure of the invention is however characterised first in that the phase-change material 22 is different from GST. It is preferably an alloy of germanium (Ge), tellurium (Te) and carbon (C), the latter element being present at a proportion of between 1% and 25% and preferably between 3% and 25%. This alloy, particular to the invention, is called GeTeCx %, which indicates the specific percentage of carbon contained in the various alloys actually used for implementing the invention, as will be seen below.

The memory structure of FIG. 1 is moreover characterised by the presence, on the layer 20 of the phase-change material 22 preferably made from GeTeCx %, of a supplementary layer 25 of titanium (Ti) with a typical thickness of between 3 and 10 nm, preferably between 4.5 and 5.5 nm and even more preferably approximately 5 nm (1 nanometer or nm=$10^{-9}$ meters). Preferably, this layer of titanium 25 is deposited directly in contact with the layer 20 of phase-change material 22.

It will also be seen that the addition of carbon in a proportion of between 1% and 25% and preferably between 3% and 25% to the alloy traditionally used, GST, in combination with the layer of titanium 25 the thickness of which is between 3 and 8 nm, is a particularly advantageous alternative solution. The invention also covers this alternative solution.

According to one alternative, the carbon (C) is replaced by indium (In). The invention thus extends to a phase-change material formed by an alloy comprising germanium (Ge), tellurium (Te) and indium (In) or formed from an alloy comprising germanium (Ge) antimony (Sb), tellurium (Te) and indium (In), the proportion of indium (In) in the alloy being between 1% and 25% and preferably between 3% and 25%. In the remainder of the description, these two alloys are respectively referred to as GeTeInx % and GSTCInx %.

An alloy of germanium (Ge) and tellurium (Te) with either carbon (C) or indium (In) added will be referred to as GeTeC/Inx %. Likewise, an alloy of germanium (Ge), antimony (Sb) and tellurium (Te) with either carbon (C) or indium (In) added will referred to as GSTC/Inx %.

In the alloy of GeTeC or GeTeIn, the germanium and tellurium are in substantially stoechiometric proportions. Typically, they are in relative proportions of 50/50 plus or minus 3%.

In the GSTC or GSTIn alloy, the germanium, antimony and tellurium are in substantially stoechiometric proportions. Typically they are in proportions equal to plus or minus 3% and preferably plus or minus 1%. According to another embodiment, the germanium, antimony and tellurium are respectively in proportions of 2, 2 and 5 that is to say 22%, 22% and 55%.

Unexpectedly, the association of these alloys having very specific proportions of carbon or indium with a layer of titanium 25 the thickness of which also has a very specific thickness, makes this layer of titanium 25 act as a stabiliser of the amorphous phase of the alloy, thus combatting the natural tendency to recrystallisation of this type of phase-change material under the effect of a thermal stress.

The following description refers more particularly to the embodiment comprising GeTeCx % and a layer of titanium; however, all the features and advantages given for this embodiment are applicable to the embodiments comprising on the one hand GSTCx % or GeTeInx % or GSTInx % and on the other hand a layer of titanium, the invention not being limitative of one or other of these embodiments.

As seen previously, conventionally with this type of device, in order to electrically program the memory structure of FIG. 1, a current 60 will be circulated between conductive electrodes, which will have been disposed on either side of the layers including the layer 20 of phase-change material, the GeTeCx % and its layer of titanium 25. The current 60 therefore circulates between a bottom electrode 30 and a top electrode 40 of the cell through the heating means 10 and the layers 20 and 25. It is the passage of the current 60 that causes the heating giving rise to a stable change in the atomic structure of the phase-change material 22 after cooling.

The invention specifically provides for the layer of phase-change material, the GeTeCx %, to be deposited in such a way that the material is, at the end of the process of manufacturing the device, in an amorphous state. This is obtained conventionally by means of a deposit effected at low temperature, or even at ambient temperature, of the CVD or PVD type, acronyms for chemical vapour deposition and physical vapour deposition.

The final phases of the method for manufacturing a device of the type produced by the microelectronic industry are termed BEOL, the acronym for back end of line. They consist essentially of the interconnection of the elementary components, typically the memory cells, together, and to the outside, by means of metal pads and connections defined by photolithography. For example, the BEOL steps are performed after the definition of the front end, i.e. the transistors for the logic and memory points. In practice, after the top layer, made from TiN for example as in an embodiment described previously, there could be: a deposition of encapsulation oxide that is done at high temperature (350° C. to 400° C. for a hundred or several hundreds of seconds); next CMP; next the deposition of the line of copper metal for example, which can be done at lower temperature (i.e. 250° C. for a hundred or several hundreds of seconds for example); next a deposition of oxide or SiN referred to as "intermetal" (350° C. to 400° C. for a hundred or several hundreds of seconds); then this ends with aluminium pins (eg 300° C.).

More generally and normally, during these BEOL steps, the memory cells of the type described in FIG. 1 must withstand temperatures ranging up to 400° C., typically, for a few minutes and up to around ten minutes.

One feature of the invention is that the phase-change material chosen, GeTeCx %, in combination with its layer of titanium 25, will however not recrystallise, its crystallisation temperature being above this value.

BEOL steps can also be implemented at temperatures a little less high, which do not exceed 350° C. Referred to as "cold" BEOL, this type of end of line operation allows the use, preferably in combination with the layer of titanium, of materials such as GST comprising carbon or indium mentioned above and referred to respectively as GSTCx % and GSTInx %.

At this stage it should therefore be noted that one feature of the invention is that, before pre-programming and assembly, that is to say at the end of the conventional or cold BEOL steps, all the memory cells are initially in an original amorphous state resulting from the manufacturing method and the structure described above.

It should be noted that, in the context of the present invention, the original amorphous state is also referred to as highly resistive original state or original state obtained at the end of the manufacture of the memory cells and before programming of the memory cells, that is to say before application of an electric programming current. Moreover, the crystallised state is also referred to as weakly resistive electrical programming from the original state obtained at the end of the manufacturing of the memory cells and before programming of the memory cells.

The original amorphous state is a state in which the structure of the phase-change material may be completely amorphous. This original amorphous state may also be a state in which the structure of the phase change material may be partially crystallised. Typically but not limitatively the volume of crystallised material is then nevertheless less than 30% of the volume of phase-change material.

In general terms, the original amorphous state is the state, at least partly amorphous or completely amorphous, that is obtained at the end of the method for manufacturing memory cells and which has not been altered by any passage of programming current. This original amorphous state is obtained before assembly, by soldering or refusion for example, of the device containing the memory cells in a system.

The original amorphous state is characterised by a distribution of values of resistances that differs by at least a factor of 1.5 and preferably a factor of at least 2 with respect to the distribution, after the assembly step, of resistances of the memory cells situated in a state with a lower resistance obtained by electrical programming. This difference in value of resistances between the cells in the high-resistance state and the cells in the low-resistance state is clearly illustrated in FIG. 10 commented on below.

Figure 2:
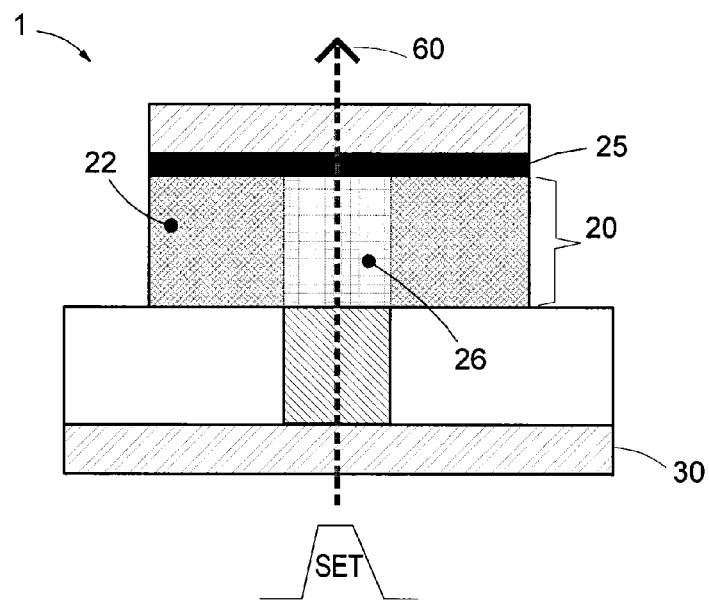
FIG. 2 illustrates a feature of the invention where some of the memory cells of a device are pre-programmed by proceeding with a local recrystallisation of the phase-change material from its original amorphous state.

Another feature of the invention that is illustrated by FIG. 2 is that the pre-programming of the PCM device before assembly on the printed circuit will consist of electrically programming some of the cells by passing therethrough a suitable current pulse 60 so that they recrystallise locally 26 and therefore have a low resistance to the read circuit. Two electrical states can thus be defined, making it possible to pre-store one information bit per memory cell: the one with high resistance corresponding to the original amorphous state issuing from the method for manufacturing the memory cells and which was not altered by any passage of programming current; and the one with low resistance electrically defined by a local recrystallisation 26 of some of the memory cells 1 obtained by an operation of the SET type described previously. This recrystallisation 26 may be in the form of a single crystalline zone as depicted schematically in FIG. 2. It may also consist of a plurality of crystalline filaments or crystalline percolation paths. Advantageously, these paths connect the heating element 10 to the electrode 25.

These two states will therefore not be affected by the thermal stress resulting from the soldering operation by refusion that will follow since, as has been seen, the maximum temperature that must be withstood is then 260° C., which is much less than the 400° C. of the conventional BEOL steps or the 350° C. of the so-called "cold" BEOL steps. Consequently the cells that will have been left in the original amorphous state after pre-programming will remain unchanged and those that will have been recrystallised locally electrically will also not be affected since, as has also been seen already, the crystalline state is naturally stable. A slight drift may nevertheless be observed as explained with reference to FIG. 10.

The objective of the invention is thus achieved, which makes it possible to continue to pre-program, before assembly and soldering by refusion, the memory devices of the PCM type manufactured according to the method and structure of the invention.

Figure 3:
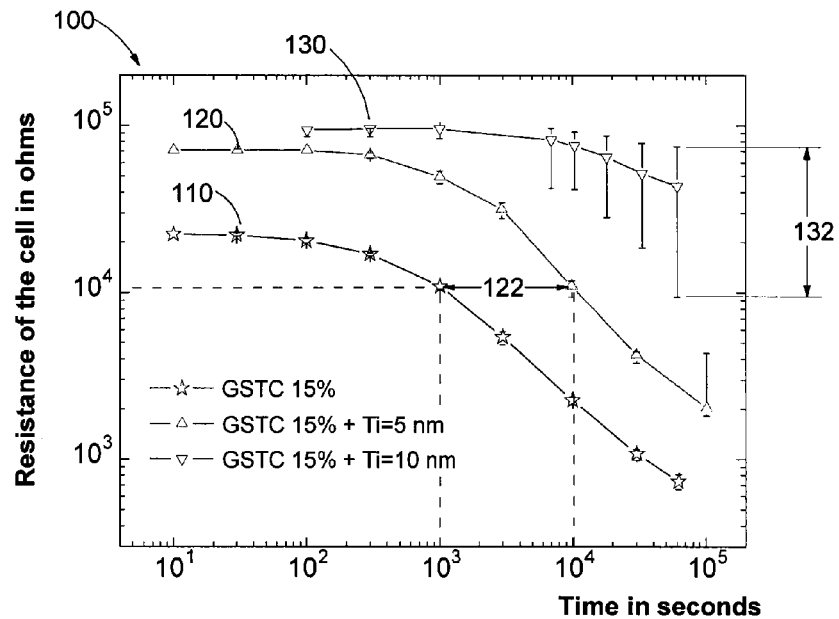
FIG. 3 shows experimental results concerning the structure of the memory cell and the phase-change material used according to an example embodiment of the invention.

FIG. 3 shows experimental results supporting the results obtained with the embodiment of the invention described in the previous figures. The diagram 100 indicates, on the Y-axis, the resistance measured at the end of the process, after the BEOL steps of PCM memory cells produced according to three different options. In the three cases the material is GST doped with carbon in a proportion of 15% (GSTC15%). The diagram shows the influence of the presence of the layer 25 of titanium and its thickness. The curve 110 concerns, for comparison, devices without a layer of titanium. The curve 120 represents the behaviour of devices produced with a layer of titanium to a thickness of 5 nm where an improvement 122 in the retention time of an order of magnitude ($\times 10$) is indeed found. The increase in the thickness of the layer of titanium further accentuates this improvement, as shown on the curve 130 corresponding to a thickness of titanium of 10 nm with however a greater dispersion 132 of the results obtained.

It should be noted here that, in the context of the present invention, the percentages of carbon or indium mentioned are those actually measured in the corresponding alloy, for example by means of the following well known methods such as:

EELS, the acronym for electron energy loss spectrometry, or

EDX, the acronym for energy dispersive X-ray spectroscopy.

These two methods are well suited for analysing the composition of small devices such as memory cells. They can be applied to slices obtained by TEM, the acronym for transmission electron microscopy.

The following methods may also be used, but they apply to larger dimensions, particularly to plates: those referred to as RBS, the acronym for Rutherford backscattering spectrometry, used to determine the structure and composition of materials by analysis of the backscattering of a beam of high-energy ions striking a sample. Other methods are also used for the same purpose, such as those known as PIXE, the acronym for particle-induced X-ray emission.

The percentages expressed are molar percentages, that is to say they represent the ratio of the number of atoms of the species concerned, carbon for example, to the total number of atoms in the alloy. This is therefore a dimensionless number measured in the phase-change material after manufacture of the memory cell.

Figure 4:
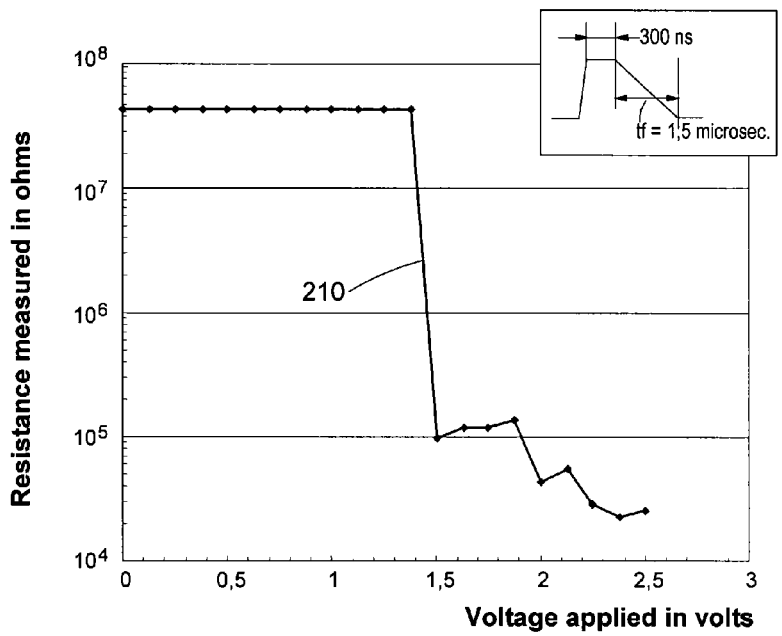
FIG. 4 illustrates the SET or electrical annealing operation that is applied to some of the memory cells with a view to pre-programming thereof before assembly.

FIG. 4 illustrates the SET or electrical annealing operation that is applied to some of the memory cells with a view to pre-programming thereof before assembly in a printed circuit and therefore before soldering by refusion. This SET operation is performed using the original amorphous material obtained at the end of process of manufacturing a wafer, that is to say after the BEOL steps, and corresponds to the case of a material and a structure referenced 120 in FIG. 3 and to the structure in FIG. 1 where the phase-change material is GeTeCx %, between 7% and 16%, in combination with a layer of titanium with a thickness of 5 nm.

The SET or electrical annealing operation after BEOL consists of applying a sufficient voltage between the electrodes 30 and 40 of each cell that has to be pre-programmed so as to locally recrystallise it 26 as shown schematically in FIG. 2. This is achieved by applying a voltage pulse, typically with a duration of 300 nanoseconds (nanosecond or nm=$10^{-9}$ seconds) and a sufficient amplitude to cause locally an abrupt transition from the initial amorphous state, also referred to as the original amorphous state. Combined with slower descent times ($t_f$), around 1.5 microseconds ($10^{-6}$ seconds), this makes it possible to achieve progressive cooling that ensures good recrystallisation of the phase-change material and therefore low electrical resistance. The curve 210 in FIG. 4 shows the resistance measured after application of the electrical pulse. It is therefore necessary to apply, in this example corresponding to GeTeC7%, a pulse with an amplitude of at least 1.5 volts in order to obtain the crystalline transition from the original amorphous state obtained after manufacture of the wafers according to the method and with the structure of the invention.

Figure 5:
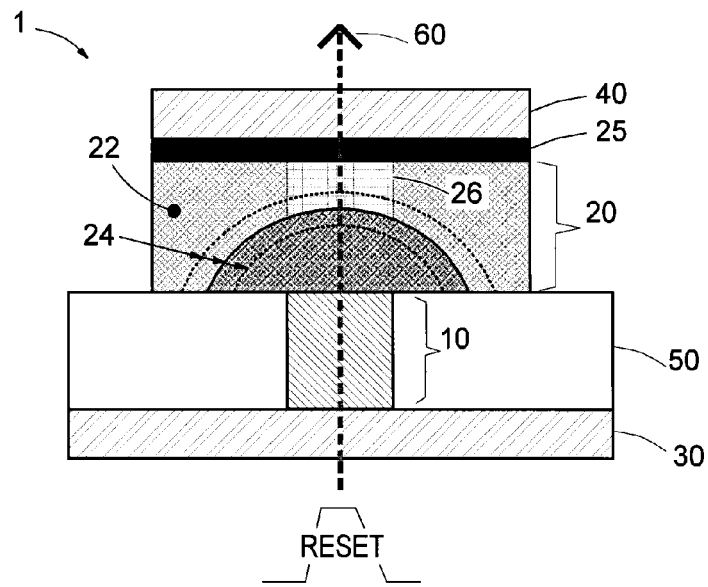
FIG. 5 illustrates the electrical RESET operation that is performed during the functional use of the device after it has been assembled.

FIG. 5 illustrates the electrical RESET operation that is performed during the functional use of the device after it has been assembled, for example, in a computerised embedded system. The RESET, that is to say the electrical amorphisation of the phase-change material in order to programme a cell, is a standard operation that will potentially be able to be performed throughout the life of the device whenever it is wished to put a memory cell in a high-resistance state again. As explained previously, the electrical RESET operation consists of passing through the device a current 60 the duration and waveform of which are controlled so that, after cooling, the material is in an amorphous state.

Here it is important to note that the amorphous state obtained electrically is different from the original amorphous state resulting from the method of manufacturing the device and which has not been affected by the BEOL steps. In particular, the area made electrically amorphous typically develops in the shape of a mushroom corolla 24 more or less extended from the heating means 10. The zone 24 made electrically amorphous prevents the passage of the current as soon as it is sufficiently extensive, which has the effect of putting the memory cell back in the high-resistance state. In normal use of the device, after pre-programming and soldering of the device containing the PCM memories of a printed circuit, crystalline zones 26 of a previous crystallisation may remain.

It is also important to note that this electrical amorphisation cannot under any circumstances, whatever the characteristics of the programming pulse used: duration, shape and intensity, make it possible to find the original amorphous state which alone can without drawback withstand the thermal stress of the solder reflow during assembly. This is because it is the highly disordered state of the original amorphous phase that creates a sufficiently high energy barrier to prevent recrystallisation thereof during soldering (or during any other operation generating a thermal stress) and confers on the chosen alloy, in combination with the layer of titanium, its thermal stability. The electrical amorphisation does not confer this property on it.

It should be noted finally that the layer 20 of phase-change material 22 is in the original amorphous state over its entire thickness, which is typically 100 nm. The corolla 24, formed electrically, may be much thinner since it suffices for it to obstruct the conduction path from the heating means 10 in order to make the memory cell highly resistant.

Figure 6:
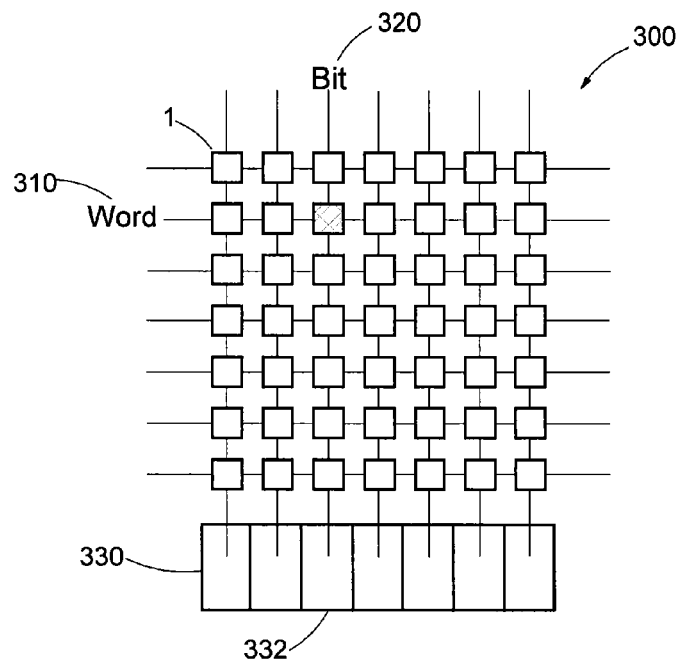
FIG. 6 illustrates a memory structure in which a PCM memory cell according to the invention can be used.

FIG. 6 illustrates a conventional memory structure in which a PCM memory cell according to the invention can be used. In general terms the memories (or matrix of memory cells) manufactured by the microelectronic industry are organised in the form of a matrix 300 of rows and columns in which a memory cell 1 is placed at each intersection. A memory cell is selected using means that are not shown by activating a row and at least one column simultaneously. Traditionally each row serves to select a word and is called a "word row" 310. Each column serves to select a word bit and is therefore called a "bit row" 320. At the end of the bit rows read and write circuits 330 are placed, which serve to read the content of the cells and to modify it. Conventionally, for reasons of performance and simplicity of implementation, each bit row is provided with its own read and write circuit 332.

In the case of PCM memories, each write circuit is designed firstly, in reading, so as to be able to distinguish at least two resistance levels corresponding to the main states: amorphous and crystalline. Secondly, in reading, each circuit 332 is at a minimum capable of generating a pulse or a series of controlled SET and RESET pulses in order to modify the crystalline or amorphous phase of a memory cell the content of which it is wished to change. It should be noted that, in the case of writing, the procedure may consist of first of all systematically putting the material back in its high-resistance amorphous state (RESET) before optionally proceeding with a recrystallisation (SET) if it is necessary to store therein a low-resistance state.

According to a particular aspect of the invention, each read and write circuit 332 will also include the means for being able to distinguish between more than two states of the phase-change material. That is to say that alone, or in combination with other control circuits (not shown) of the memory device, the read and write circuits 330 will be capable of recognising all the states that were mentioned previously and set out below:

| States: | Mode: |
|---|---|
| Original high-resistance amorphous state obtained at the end of the process of manufacturing a wafer and which remains unchanged after the BEOL steps. The layer of PCM material 22 is initially in this state. | Reading before (for example for checking) or after assembly. |
| Crystalline state obtained electrically by the passage of at least one SET pulse adapted for duration, shape and intensity in order to cause a local recrystallisation 26 from the initial original amorphous state in order to pre-programme a selection of cells before solder reflow of a PCM device according to the invention in an embedded system (electrical annealing). | Writing during pre-programming, possibly before an assembly step generating a thermal stress. Reading before (for example for checking) or after assembly. |
| High-resistance amorphous state obtained electrically by passing at least one RESET pulse suitable in duration, shape and intensity for causing a local amorphisation 24 in functional mode. | Reading and writing in functional mode. |
| Low-resistance crystalline state obtained electrically by passing at least one SET pulse suitable in duration, shape and intensity for causing a local recrystallisation 26 in functional mode. | Reading and writing in functional mode. |

Figure 7:
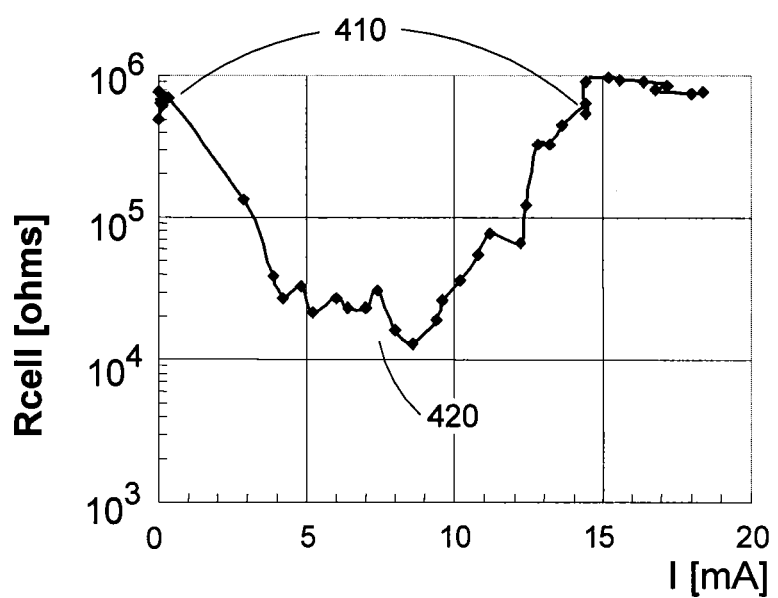
FIG. 7 shows the resistance values observed in functional mode resulting from the electrical SET and RESET operations.

FIG. 7 shows an example of resistance values resulting from the electrical SET and RESET operations described above. This figure illustrates the normal functioning mode of a memory cell according to the invention where the resistance of the cell can be made to change reversibly between high values 410 corresponding to an electrical amorphous state and low resistances 420 corresponding to a crystalline state.

Figure 8:
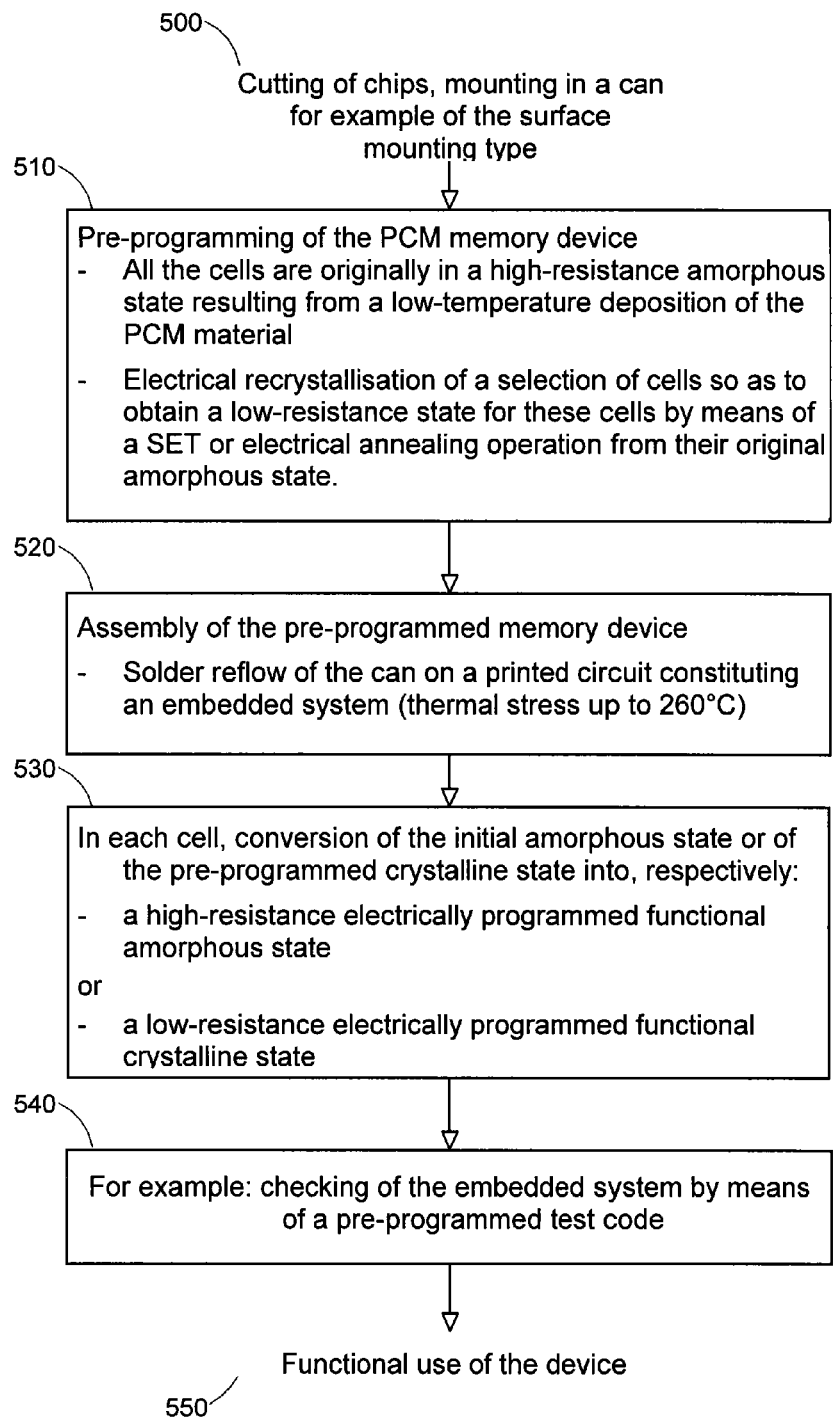
FIG. 8 describes an example of a procedure for implementing the invention from the pre-programming phase as far as the step of functional use of a PCM memory device according to an example embodiment of the invention in an assembly of the computerised embedded system type.

FIG. 8 describes an example of a procedure for implementing the invention from the pre-programming phase as far as the step of functional use of a PCM memory device in an assembly of the computerised embedded system type.

In the example illustrated by FIG. 8, the procedure applies typically at the end of manufacture of the wafer on which a chip, that is to say a set of memory cells, will have been manufactured. Usually very many memory cells are manufactured on the same wafer and only some of them are incorporated in the same device.

The first step illustrated in FIG. 8 is step 500, which shows the mounting of the chip in a can, for example of the surface-mounting can type of a printed circuit. At this stage, the memory device then comprises a can as well as memory cells. If the memory cells of several devices are manufactured on the same wafer, the mounting step is preceded by a step of cutting the wafer.

As will be seen in detail hereinafter, the pre-programming can also be carried out at the wafer level, before cutting of the chips, for example by means of suitable apparatus that gives access successively to the connection pads or pins of each of the chips on the wafer. Equipment such as that used for testing integrated circuits on a wafer of the "test machine under spikes" type.

Step 510 consists of pre-programming, with a code or specific data, the devices that are intended for a particular application. All the cells are initially in a high-resistance original amorphous state as deposited. The pre-programming consists of electrically recrystallising a selection of cells in order to confer on them a low electrical resistance by means of an SET operation from the original amorphous state. The recrystallisation is partial 26.

It should be noted that, according to one embodiment, the pre-programming 510 at each wafer is performed before mounting, typically in a can, of the memory cells. The pre-programming step is therefore performed after optional cutting of the wafer part comprising the cells of the device to be incorporated in the can. In this embodiment, step 500 is therefore performed before the step 510 illustrated in FIG. 8.

According to another embodiment the pre-programming 510 at each wafer is performed before mounting 500 of the memory cells typically in a can. This pre-programming step can even be performed before the cutting of part of the wafer comprising the cells to be incorporated in the can. In this embodiment, step 510 is therefore performed before step 500.

As has been seen, the above states are thermally stable. It is then possible to proceed with the assembly 520 of the PCM memory device or devices and the other devices constituting the embedded system. During this operation it is possible for example to subject to solder reflow all or some of the components on the printed circuit. This has the effect of applying a thermal stress of up to 260° C. to the components of the embedded system without however there being any loss of pre-programmed information in the PCM memory cells of the invention for the reasons mentioned above and repeated below. This is because, firstly, the recrystallisation of the material used, initially amorphous, and the structure of the cell, mean that this temperature is at least above the 350° C. of a so-called cold BEOL and therefore much higher than the 260° C. of the thermal stress due to soldering. Secondly, the cells that have undergone partial recrystallisation are naturally stable.

Optionally but advantageously, after assembly the pre-programmed states are converted 530. This is because the original amorphous state cannot be reproduced electrically and will not be able to be used functionally. Moreover, the electrical recrystallisation operation from the original amorphous state may be significantly different from a functional SET operation. In particular, because the functional RESET and SET operations are adapted so as to be the most efficient possible in terms of speed of execution whereas the pre-programming, executed only once, does not need to be particularly rapid and must only seek to produce a stable state capable of resisting the thermal stress of the soldering.

As discussed previously, the conversion will be done using the particular features of the invention of the read and write circuits 330 appearing in FIG. 6; this, possibly, under the control of specialised circuitry (not shown) intended to perform this conversion automatically after assembly.

According to a first option, during the conversion step 530, it is possible to convert each cell having an original amorphous state and each cell having a pre-programmed crystalline state into respectively: a cell having a high-resistance electrically programmed functional amorphous state, and a cell having a low-resistance electrically-programmed functional crystalline state.

According to a second option, not illustrated in FIG. 8, during the conversion step, it is possible to convert each cell having an original amorphous state and each cell having a pre-programmed crystalline state into respectively: a cell having a low-resistance electrically-programmed functional crystalline state and a cell having a high-resistance electrically-programmed functional amorphous state. Thus, in this embodiment, the crystalline and amorphous phases are reversed during the conversion step.

Optionally, according to particular implementations of the invention, it will not be necessary to convert the pre-programmed states into amorphous and crystalline functional states. For example, the read circuits 330 can be designed so as to be compatible and capable of differentiating between firstly an original amorphous state and an electrical amorphous state and secondly a pre-programmed crystalline state or a functional crystalline state. The information stored being more generally binary it suffices in fact to distinguish between two high-resistance states (original amorphous and electrical amorphous) and two low-resistance states (crystalline pre-programmed from the original amorphous state or functional crystalline) in order to be able to read two different states. In this embodiment, the step corresponding to the step referenced 530 in FIG. 8 is therefore omitted.

As soon as the conversion has been executed, if it is necessary, the code or the pre-programmed data can be used functionally. Typically, at least one test code 540 of the embedded system will have been pre-programmed. It will be able to be executed under the control of a microprocessor or microcontroller in order to ensure the integrity of the embedded system and correct functioning thereof.

The code and/or data necessary for the functioning of the embedded system will also have been pre-programmed and converted as explained above if necessary. In which case the embedded system may immediately become functional 550.

Optionally, only the test code may have been programmed. In this case, it will be necessary to proceed with the in situ loading of the operational code before use of the embedded system, with the drawbacks mentioned in the section on the prior art.

Whatever the options chosen, which depend essentially on the application and parameters such as the memory size available, the possibility of being able to pre-programme, before assembly, a PCM memory device according to the invention preserves all the advantages offered by this technique in the context of industrial production of embedded systems. Advantages that are lost if a standard non-volatile memory of the PCM type is used.

Figure 9:
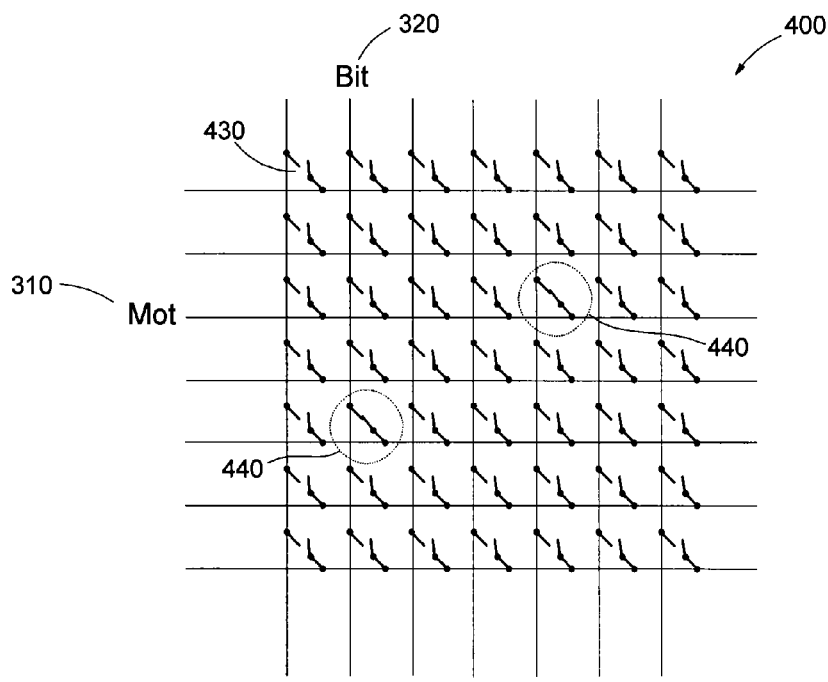
FIG. 9 illustrates in a simplified manner a single-programming memory (OTP) that can be obtained with the invention.

FIG. 9 illustrates more particularly an advantageous application of the invention when, for example in an embedded system, recourse is had to the use of a read-only memory component, usually designated by its acronym ROM. Typically recourse is had to this type of component for storing the operational code of an embedded system at the end of its period of development when it is no longer liable to have to be changed. The programming of such a memory is done only once for a given application. This type of component is thus referred to as OTP the acronym for "one-time programmable". The programming can be done by generating manufacturing masks specific to each application. This is obviously fairly expensive and is generally justified only for devices produced in very large quantities. There exist other types of OTP read-only memory. These are in particular cells that use, for each memory point, "fuses" or "anti-fuses" electrically programmed once. A fuse being, as the name suggests, a "closed" conductive element that it will be possible to melt in order to programme a non-conductive "open" state. An anti-fuse being the opposite, it is normally open and the programming makes it possible to close it, that is to say to bring it into a low-resistance conductive state. It is this type of memory matrix that is shown schematically in FIG. 9. Conventionally, as already described in FIG. 6, the memory is organised in the form of a matrix of rows 310 and columns of memory points that are normally open 410 at the end of the manufacturing steps. The programming will consist of closing 420 some of the anti-fuses during a preliminary phase of personalisation of the matrix for a particular application of the embedded system in which it is used. Thus the matrix comprises, at each crossing between row and word, a memory point, and preferably also its selecting element, in order to avoid leakage currents during the reading operation in the configuration without a selector element.

The invention is particularly suited to this type of application since the recommended PCM alloys, characterised by a high crystallisation temperature, are affected, as has been seen, neither by the heat treatments at the end of the process (BEOL) nor by those resulting from the solder reflow of the chips in their cans. At the end of the process, the memory cells described previously that constitute the matrix 400 are then all in a high resistance state resulting from the deposition in an amorphous phase of one or other of the materials recommended by the invention. All the cells of the ROM memory are the initially in an "open" state 410 as in the case of an anti-fuse. The programming will be able to be done on the wafer itself by applying, using electrical means for selecting the rows 310 and writing means situated at the column foot 320, each of the cells that must be pre-programmed in a "closed" state 420, that is to say in a low-resistance state. The electrical selection and writing means are similar to those described in FIG. 6. Optionally the programming will also be done in situ.

All the non-programmed cells remain in their original amorphous state obtained at the end of the process. It is, as has been seen, a high-resistance state that is naturally stable and will not change throughout the life of the device using these memories. A device that may be designed to function in an environment at high temperature because of the crystallisation temperature, itself high, of the phase-change materials recommended by the invention. Such a device is thus perfectly suited for functioning close to components giving off large quantities of heat, such as combustion engines that are encountered for example in the automobile field.

The programming of the cells in their closed state 420, with low resistance, is done only once from the original amorphous state, as explained in FIG. 4, by means of an SET or solder reflow operation. The low-resistance crystalline state obtained is also naturally stable and will also not change throughout the life of the device. In this way a programmable read only memory (PROM) is obtained. It should be noted here that the write means mentioned above have to be designed only to allow a single execution of an SET operation from the original amorphous state. The corresponding circuit can be simplified. Since writing is done only once, the speed of execution of this operation is not critical and has no impact on the functional mode which is in reading alone.

Optionally, the write circuit can be designed to enable a RESET operation to be able to be done also for the purpose of correcting incorrect programming of a low-resistance state. However, as already discussed, it is then not possible to regain the original high-resistance amorphous state. This personalisation mode can however be envisaged, at the cost of a complication of the write means with respect to the previous case, to enable the memory to become electrically reprogrammable, in particular if the correction affects only a small proportion of the memory points, the majority then remaining in their original amorphous state.

There are several advantages related to the use of such a PROM memory:

In the very frequent case of simultaneous use of ROM and non-volatile memory in the same device, the same technology and the same method can then be used for the two types of memory.

The information can be programmed at the wafer level, at the end of the manufacturing line and before mounting of the chips, with the advantages mentioned in the section on the prior art concerning confidential data that these memories may have to contain. These data may in fact be introduced before assembly in order not to have to control the distribution of this sensitive information beyond the manufacturing line.

Unlike fuse memories it is very difficult if not impossible to perform on these circuits what is generally referred to as reverse engineering. During a reverse engineering operation it is sought to find the programming of a PROM by observing, with a microscope, for example of the transmission electronic microscopy (TEM) type, the programmed fuses, that is to say those that were melted during programming. With memories of the PROM type, this operation of viewing the resistive state of the memory points is easy and commonly practiced to analyse the products of competitors or to recover data. Advantageously, using a memory cell according to the invention, the physical modification of the material of the closed memory points, those where a low resistance has been programmed, is on the other hand not viewable. The invention thus offers a considerable advantage in terms of protection of the data.

In the context of the development of the present invention, it has in fact been found that the memory cell in the original amorphous state is distinguished from the memory cell in the crystalline state obtained from the original amorphous state only in that, in the original amorphous state, a portion of the layer of phase-change material is in an amorphous state whereas, in the crystalline state obtained from the original amorphous state, this same portion of the layer of phase-change material is pierced. This difference, therefore relating only to the partial rupture of a portion of the layer of phase-change material, is not detectable or detectable only with great difficulty by means of an operation with a TEM. The portion of the layer 20 of phase-change material 22 used in the context of the present invention, the phase of which varies, is situated close to the heating means 10. Conversely, it has been remarked that another portion of the phase-change material 22, a portion distant from the heating means 10, does not have its phase vary when the cell passes from a highly resistive state to a weakly resistive state. This portion of phase-change material 22 distant from the heating means remains in fact in the original amorphous state.

Thus, in a matrix of memory cells using the present invention, all the memory cells have at least one portion that is distant from the heating means and is in an amorphous state, whether the cell be in a highly resistive state, i.e. all the layer is in an amorphous state, or the cell is in a weakly resistive state, i.e. only one or some portions of the layer that is/are distant from the heating means is/are in an amorphous state, the portion close to the heating means being in a crystalline state.

An observation of a portion of the phase-change material far from the heating means, for example with a TEM, makes it possible to know whether this portion is in a crystalline or amorphous state. As indicated previously with reference to FIG. 2, the crystallised portion may comprise a plurality of crystalline filaments that can also be referred to as crystalline percolation pads. It is in the vicinity of the heating means, as indicated previously, that it is very difficult or even impossible to determine whether the material of the invention is in an amorphous or crystalline state.

Figure 10:
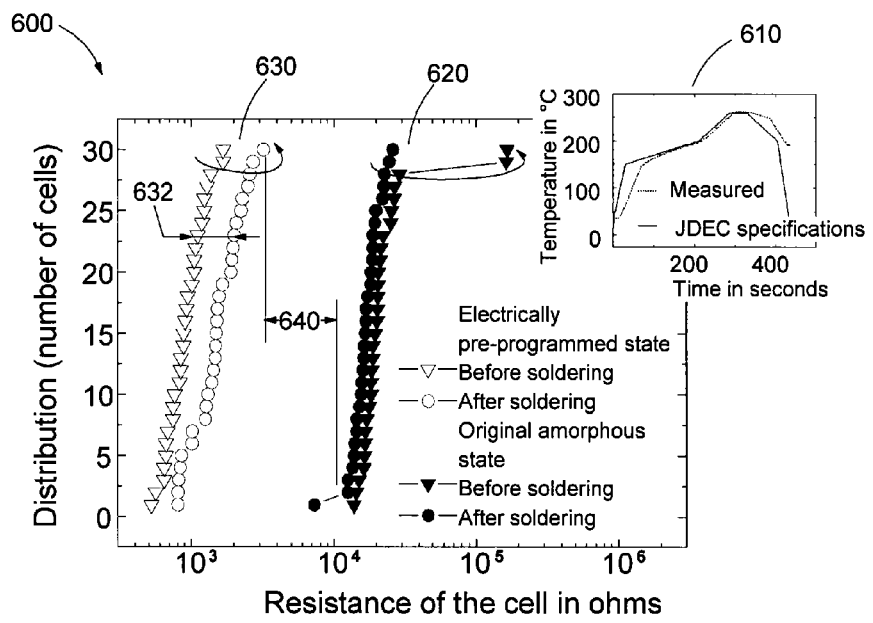
FIG. 10 is a diagram illustrating the various resistivity levels that can be obtained with a memory cell according to the invention.

FIG. 10 illustrates the beneficial effect of the use of a memory cell according to the invention, in which the phase-change material is an alloy of germanium, tellurium, antimony and carbon in an actual proportion of 15% (GSTC15%), this proportion being an actual proportion, the nominal proportion being 5%. In this memory cell, the layer of titanium has a thickness of approximately 5 nanometers. The diagram 600 shows the distribution of the resistive states of such cells measured before and after a solder reflow operation the profile of which is indicated in the insert 610.

It is found that the distribution 620 of the resistive states of the cells that were left in the original amorphous state as deposited is practically unchanged.

It is also found that the distribution 630 of the cells that were pre-programmed from their original amorphous state at a lower resistance value, by means of an electrical annealing as discussed previously, undergoes a slight drift 632 that does however preserve a sufficient margin 640 between the two states (highly resistive and weakly resistive) in order to differentiate them on reading and, after assembly (typically soldering), to find the pre-programmed information. This drift is mainly due to the assembly step. Preferably this margin corresponds to a difference in resistance at least equal to a factor of 1.5 and preferably at least equal to a factor of 2. Thus the phase-change material is chosen so that the distribution 620 of the resistances of the cells in the original amorphous state is at least 1.5 times greater and preferably at least twice as great as the distribution 630, after the assembly step (and therefore after drift), of the resistances of the cells that were pre-programmed from their original amorphous state.

As indicated previously, the pre-programming method of the present invention applies to numerous types of phase-change material and is not limited solely to the advantageous examples mentioned above. The following paragraphs describe two methods for identifying materials that can be employed in the context of the present invention.

In general terms, the materials that can be employed in the context of the present invention are the materials for which the distribution 620 of the resistances of the cells in the original amorphous state is at least 1.5 times greater and preferably at least twice as great as the distribution 630 of the resistance of the cells that were pre-programmed from their original amorphous state.

FIGS. 11a to 11d illustrate a first method for identifying materials that may suit the invention, that is to say having a high recrystallisation temperature that leaves the material used in the original amorphous state as deposited at the end of the manufacturing cycle, after BEOL.

Figure 11A:
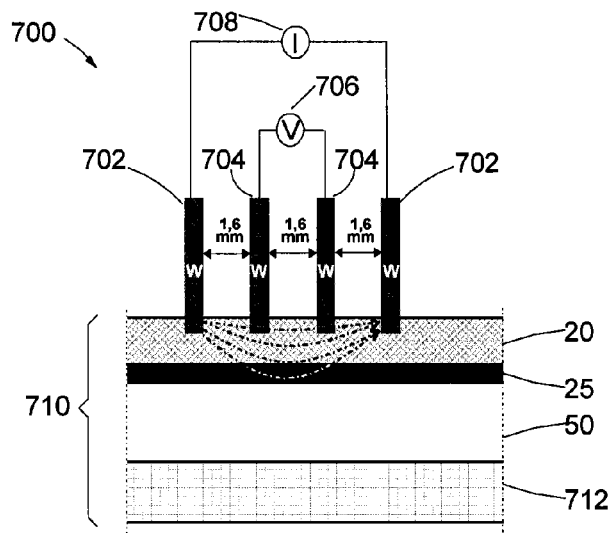
FIGS. 11a to 11d illustrate an electrical method for identifying materials that may suit the invention, that is to say having a high recrystallisation temperature that, at the end of a cycle of manufacturing the memory cells, leaves the material used in the original amorphous state as deposited.

FIG. 11a shows schematically the measuring equipment 700 that is the traditional tool used in microelectronics for evaluating the electrical resistance of the deposited layers. The measurement is made on wafers 710 where a continuous layer of the material to be measured has been deposited on the surface. The tool consists of four probes or test spikes, 702 and 704, generally made from tungsten (W), which are applied to the surface to be measured, that is to say, in the context of the invention, on the layer of phase-change material 200 that it is wished to evaluate. The measurement of the resistivity is made by injecting a current 708 between the external spikes 702 and measuring the potential difference 706 between the internal spikes 704. This method is widely practised throughout the microelectronic industry and is well known the persons skilled in the art.

Figure 11B:
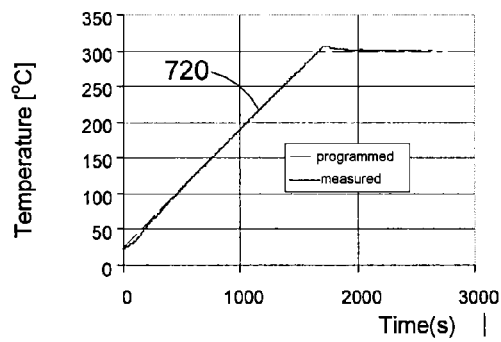

To find the crystallisation temperature of the material to be evaluated, the test device, that is to say the tungsten probes that were put in contact with the layer to be tested 20 of the wafer 710, will be subjected to increasing temperatures. As shown in FIG. 11b, the temperature of the device is for example made to increase linearly 720 by 10° C. per minute and the resistivity of the layer tested is monitored throughout the temperature rise.

Figure 11C:
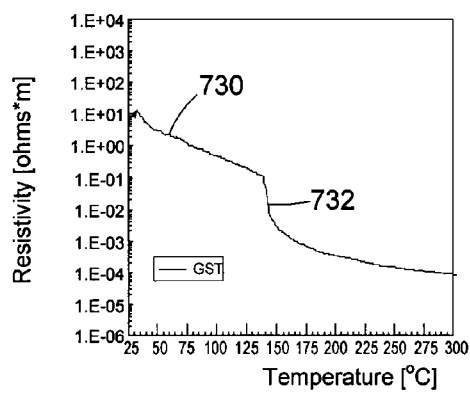

FIG. 11c shows a typical result of measurements made under the above conditions. The example of a material tested in this figure is the traditional phase-change material, that is to say GST, where it is known that its recrystallisation temperature is too low to be used in the context of the invention. There is found in fact on the curve 730, which shows the decreasing change in the resistivity as a function of temperature, an abrupt drop 732 therein when the recrystallisation occurs. This recrystallisation temperature is, as can be seen, around 150° C. for this material.

This equipment allows a rapid screening of suitable materials, that is to say those that have a sufficiently high crystallisation temperature to withstand the maximum temperatures undergone during the final manufacturing steps (BEOL), that is to say typically 400° C. for 2 minutes, while remaining in their amorphous phase as deposited. These materials are then potentially able to solve the problem posed by the loss of pre-programmed information during solder reflow using the pre-programming method of the invention.

The favourable effect of the layer of titanium on the recrystallisation temperature of the phase-change material can be assessed also with this test equipment. To do this, a test wafer 710 is prepared, which, as shown in FIG. 11a, also comprises a layer of titanium 25. In the test wafer, the layer of titanium 25 should, preferably but non-limitatively, be situated under the layer of phase-change material 20 tested. The positioning of this layer of titanium below the layer of phase-change material makes it possible in particular to limit the oxidation of the layer of titanium. The layer of silicon dioxide ($SiO_2$) 50, which is deposited on a mechanical support, for example a standard wafer or substrate of silicon (Si) 712, is also found in the test wafer. The stack of layers of a test wafer 710 intended to electrically evaluate the effect of the presence of a layer of titanium on GST therefore comprises, for example, the layer of GST 20 to a thickness of 100 nm on the layer of titanium 25 to a thickness of 5 nm. The whole is supported by Si/SiO$_2$ layers with a total thickness of 500 nm.

Figure 11D:
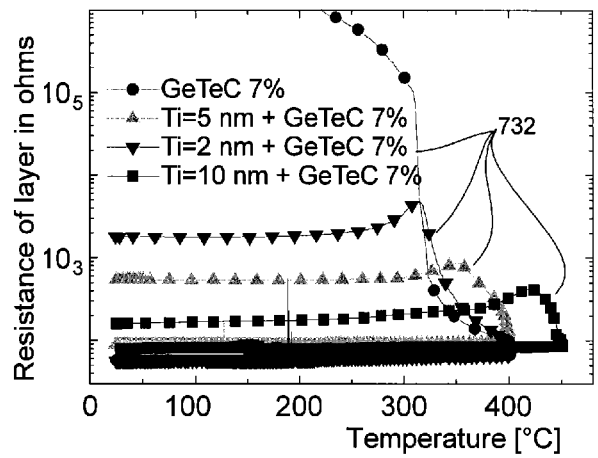

FIG. 11d shows other experimental results obtained with the method of the invention where the crystalline transition 732 is clearly visible. These results concern GeTeC7% with various thicknesses of titanium (without titanium for comparison, 2 nm, 5 nm and 10 nm). The influence of the presence of a layer of titanium, and its thickness, is noted as before. The recrystallisation temperature exceeds 400° C. with a 10 nm layer of titanium, thus satisfying the criterion for selection of the material and guaranteeing that, with the corresponding structure, the material will remain in the amorphous state as deposited at the end of the steps at the end of the manufacturing line (BEOL).

Figure 12A:
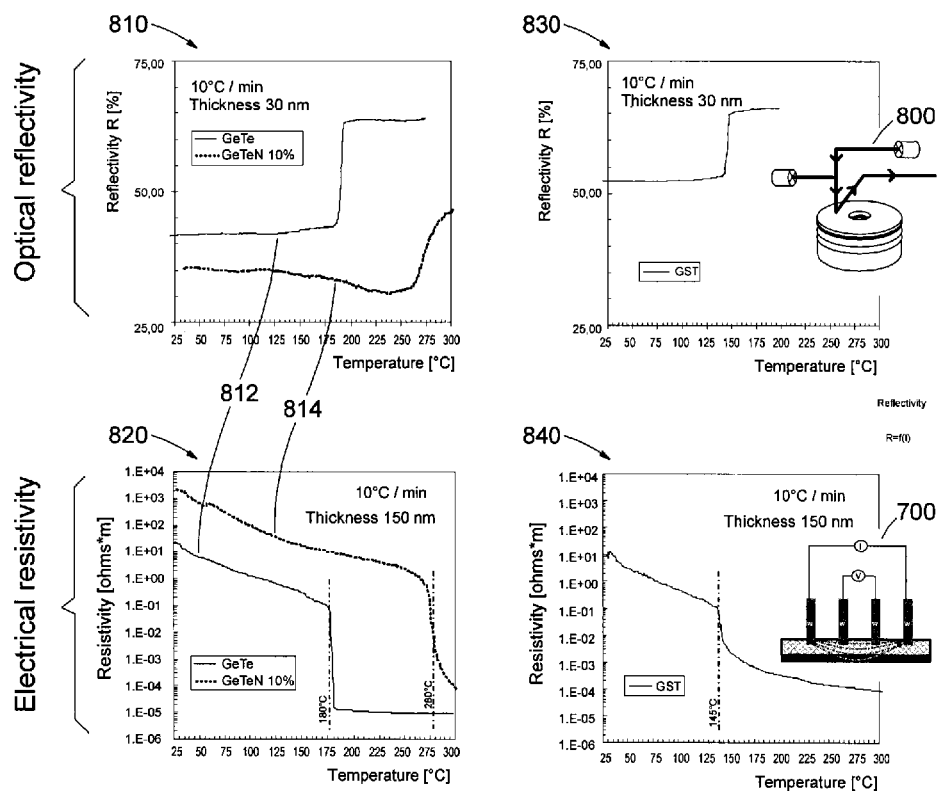
FIGS. 12a and 12b illustrate an optical method for identifying materials that may suit the invention.

FIGS. 12a and 12c illustrate another means of evaluating the recrystallisation temperature of the material tested. It is based on the change in optical reflectivity of the layer of phase-change material during the transition to the crystalline phase. This is because the previous electrical method functions better, the lower the resistivity of the layer in the crystalline phase to be measured (and low with respect to that of the material). The measurement is then not disturbed by the underlying layers. When this is the case, the crystalline transition 732 is clearly visible as shown in the examples in the FIGS. 11c and 11d. In the case where the resistivity of the layer of phase-change material to be measured is high, recourse will therefore preferably had to the optical method illustrated by FIGS. 12a and 12b.

It should be noted that in this case the test wafer 710 is prepared with the layer of titanium 25 situated above the layer of phase-change material 20 that it is wished to test.

The diagrams in FIG. 12a compare the results of the two methods and concern overall three phase-change materials. The diagrams 810 and 820 show the results obtained with respectively the optical method for measuring reflectivity and the electrical method for measuring resistivity. These diagrams concern non-doped GeTe 812, and GeTeN 814, that is to say GeTe doped with nitrogen (N). In the example illustrated, the doping with nitrogen is 10% (RBS measurement) to plus or minus 1%. The diagrams 830 and 840, similar to the previous diagrams, concern the traditional material, GST. It can be seen that there is a very good agreement between the two methods for detecting the recrystallisation temperature of the material tested. In the diagrams 810 and 820, the favourable influence of the nitrogen doping is noted, which changes the recrystallization temperature from 180° to 280° C. A value that is however insufficient to prevent recrystallisation during the BEOL steps.

The test equipment used is shown schematically in the inserts of diagrams 830 and 840. It is a case, for the measurement of resistivity, of the conventional electrical system with four spikes described in FIG. 11a. For measuring reflectivity, use is made of a conventional optical apparatus 800 utilising lasers.

Figure 12B:
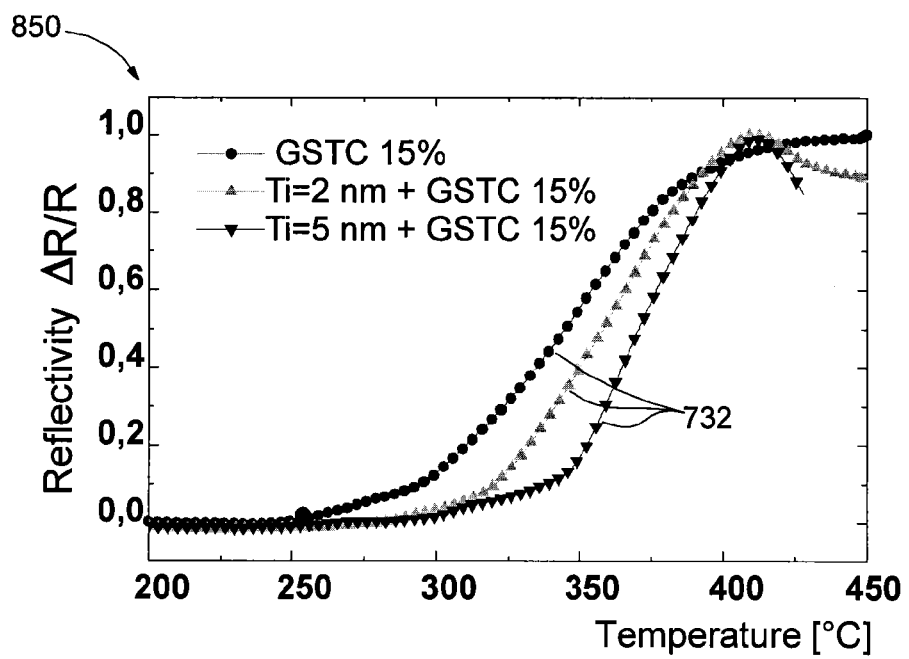

FIG. 12b illustrates the result of the measurement of optical reflectivity on a material, GSTC15%, for which measurement of resistivity does not function, in particular because of the presence of the underlying titanium layer that short-circuits the layer of this phase-change material, which is electrically very resistant in its amorphous and crystalline phase.

The crystalline transitions 732, which approach the 400° C. required to be able to pass the BEOL steps without recrystallisation, are detected here very well. As before the very favourable influence of a layer of titanium is noted, an effect which increases with the thickness deposited (2 and 5 nm).

The present invention proves particularly advantageous in all cases where the memory cells are liable to undergo high thermal stresses after programming. These thermal stresses are not limited solely to the assembly operations.

The invention is not limited to the embodiments previously described and extends to all embodiments covered by the claims.

The invention claimed is:

1. A method for implementing a system comprising a memory device, the method comprising:
   (i) manufacturing a plurality of non-volatile memory cells, each comprising a phase-change material configured to change state reversibly between at least an amorphous state and a crystalline state having different electrical resistances,
   wherein the manufacturing comprises forming a layer comprising the phase-change material having an original amorphous state at the end of the manufacturing;
   (ii) pre-programming a memory device comprising the plurality of non-volatile memory cells, by electrically recrystallizing a selection of the memory cells from their original amorphous state, to obtain a pre-programmed memory device; and
   (iii) assembling the pre-programmed memory device in the system during which the device is subjected to a temperature of between 240° C. and 300° C.

2. The method of claim 1, wherein the phase-change material is such that the lowest resistance among the memory cells where the phase-change material is in the original amorphous state is, after the assembly step, at least twice as great as the highest resistance among the memory cells where the phase-change material is in the crystalline state.

3. The method of claim 1, wherein the phase-change material comprises a layer comprising an alloy of germanium, antimony and tellurium or an alloy of germanium and tellurium, the alloy comprising 1% and to 25% carbon.

4. The method of claim 1, wherein the phase-change material comprises a layer comprising an alloy of germanium, antimony and tellurium or an alloy of germanium and tellurium, the alloy comprising 1% to 25% indium.

5. The method of claim 1, wherein the layer comprising the phase-change material is covered by a layer of titanium 3 to 10 nanometers thick.

6. The method of claim 1, wherein the assembling comprises brazing or soldering.

7. The method of claim 1, further comprising, after the assembling, converting each memory cell of the device from the original amorphous state or the pre-programmed crystalline state into respectively: a high-resistance electrically programmed functional amorphous state or a low-resistance electrically programmed functional crystalline state.

8. The method of claim 7, wherein the converting is executed under the control of the device using read and write circuits of the memory cells, wherein the read and write circuits are configured to differentiate an amorphous state from a crystalline state.

9. The method of claim 7, wherein the converting into an electrically programmed functional crystalline state comprises an electrical annealing of the memory cells of the selection from their original amorphous state.

10. The method of claim 7, further comprising checking the system using a pre-programmed code.

11. The method of claim 7, further comprising activating a pre-programmed functional code.

12. The method of claim 1, further comprising, after the assembling, converting each memory cell of the device from the original amorphous state or the pre-programmed crystalline state into respectively: a low-resistance electrically programmed functional crystalline state or a high-resistance electrically programmed functional amorphous state.

13. The method of claim 1, comprising, after the manufacturing and before the assembling, mounting the memory cells in a can.

14. The method of claim 13, wherein the mounting is performed after the pre-programming.

15. The method of claim 13, wherein the mounting is performed before the pre-programming.

16. A single-programming read only memory obtained by the method of claim 1.

17. A system obtained using the method of claim 1, wherein the device forms a read only memory or a programmable read only memory or a memory programmable only once.

18. The system of claim 17, wherein the phase-change material comprises a layer comprising an alloy of germanium and tellurium with carbon or indium added, or comprises an alloy of germanium, antimony and tellurium with carbon or indium added, wherein a proportion of carbon or indium in the alloy is between 1% and 25% and wherein the layer comprising the phase-change material is covered by a layer of titanium 3 to 10 nanometers thick.

19. The system of claim 17, wherein some of the memory cells are in an original amorphous state and the other memory cells are in a crystalline state obtained by at least partial crystallization of the phase-change material from the original amorphous state.

20. The system according to claim 19, comprising read circuits configured to read the memory cells and differentiate the memory cells situated in an amorphous state with respect to the memory cells situated in a crystalline state obtained by at least partial crystallization of the phase-change material from the original amorphous state.

21. The system according to claim 19, comprising circuits for writing to the memory cells configured so as to convert the original amorphous state into one from a functional amorphous state different from an original amorphous state or a functional crystalline state different from a crystalline state obtained by at least partial crystallization of the phase-change material from the original amorphous state and/or configured so as to convert the crystalline state obtained from the original amorphous state into the other one from the functional amorphous state and the functional crystalline state.

22. The system of claim 17, comprising write circuits configured to bring the memory cells from an original amorphous state into a crystalline state.

23. A method for pre-programming a system comprising a device, the method comprising:
(i) electrically recrystallizing a selection of memory cells from an original amorphous state in a device comprising a plurality of non-volatile memory cells, each comprising a phase-change material configured to reversibly change state between at least an amorphous state and a crystalline state having different electrical resistances, the phase-change material comprising a layer comprising an alloy of germanium and tellurium with carbon or indium added, or comprising an alloy of germanium, antimony and tellurium with carbon or indium added, wherein a proportion of carbon or indium in the alloy is between 1% and 25%;
wherein the layer comprising the phase-change material is covered by a layer of titanium 3 to 10 nanometers thick, and the layer comprising the phase-change material has an original amorphous state, to obtain a pre-programmed device; and
assembling the pre-programmed device in the system.

* * * * *